(12) United States Patent  (10) Patent No.: US 8,046,047 B2
Wong et al.  (45) Date of Patent: Oct. 25, 2011

(54) EXTENDED-COVERAGE IMAGING COIL

(75) Inventors: Eddy Wong, Cleveland Heights, OH (US); Claudia Hillenbrand, Cleveland Heights, OH (US); Jonathan S. Lewin, Beachwood, OH (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 2094 days.

(21) Appl. No.: 11/000,250

(22) Filed: Nov. 30, 2004

(65) Prior Publication Data
US 2006/0116574 A1 Jun. 1, 2006

(51) Int. Cl.
*A61B 5/05* (2006.01)

(52) U.S. Cl. ......... 600/422; 600/423; 324/313; 324/318

(58) Field of Classification Search .................. 600/423, 600/422; 324/313, 318
See application file for complete search history.

(56) References Cited

U.S. PATENT DOCUMENTS

| 6,628,980 | B2 * | 9/2003 | Atalar et al. .................. 600/423 |
| 7,048,716 | B1 * | 5/2006 | Kucharczyk et al. .... 604/164.01 |
| 2004/0044280 | A1 * | 3/2004 | Paley et al. .................... 600/410 |

FOREIGN PATENT DOCUMENTS
WO  WO 0175465 A1 * 10/2001

* cited by examiner

*Primary Examiner* — Long V. Le
*Assistant Examiner* — Ellsworth Weatherby
(74) *Attorney, Agent, or Firm* — Kraguljac & Kalnay, LLC

(57) ABSTRACT

Extended-coverage magnetic resonance imaging coils with optimized homogeneity in longitudinal sensitivity are described. One exemplary coil includes four elements, where two of the elements are opposed-solenoid imaging elements and two of the elements are single loop imaging elements.

11 Claims, 10 Drawing Sheets

Prior Art Figure 1

EXTENDED-COVERAGE IMAGING COIL

FEDERAL FUNDING NOTICE

Portions of the claimed subject matter were developed with federal funding supplied under Federal Grants R01 CA81431-01 and R33 CA88144-01.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

Applications for magnetic resonance imaging (MRI) include minimally invasive, diagnostic and therapeutic procedures like the examination of hollow organs, tubes, and so. For example, MRI may be used in intravascular examinations. In these applications, various imaging coils that may include dipole antennas, single loop antennas, opposed-solenoid antennas, and the like are employed to facilitate visualizing items like a blood vessel wall. Intravascular visualization facilitates tasks like identifying and characterizing atherosclerotic plaque components. In some applications, the imaging coils may be mounted on, be positioned, maneuvered and so on, by a catheter.

Opposed-solenoid antenna configurations are based on groups of loops (e.g., helical loops) separated by a gap, with current being driven in opposite directions on either side of the gap. Within the gap, field lines protrude beyond the diameter of the loops, providing a substantially homogenous region of sensitivity suitable for endovascular imaging. Opposed-solenoid imaging antennas may have a limited area of longitudinal coverage that may reduce effectiveness in, for example, survey imaging in coronal or sagittal planes. The area of longitudinal coverage may be limited, for example, to a region resulting from the additive contributions of flux lines from each individual solenoid winding.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

Prior Art

DETAILED DESCRIPTION

Figure 1:
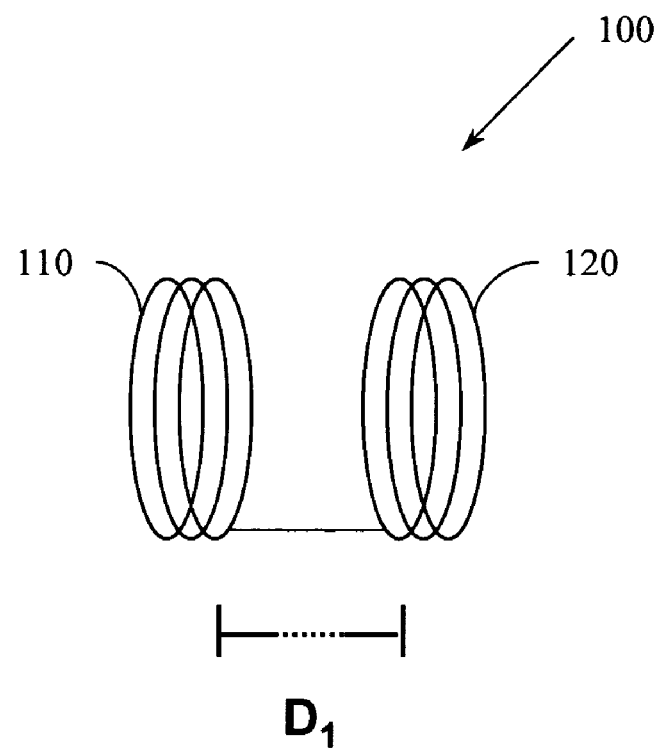
FIG. 1 illustrates an example opposed-solenoid antenna.

Example extended-coverage multi-element imaging coils are described herein. The multi-element imaging coils facilitate extending a coverage area provided in MRI applications like intravascular imaging. In one example, a four element extended-coverage imaging coil is provided where two elements are opposed-solenoid antenna elements and two elements are single-loop antenna elements positioned outside the two opposed-solenoid elements to provide extended-longitudinal coverage. In another example, a four element opposed-solenoid imaging coil is provided where all four elements are opposed-solenoid elements. Conventional opposed-solenoid elements are evenly spaced while the spacing between elements in the example extended-coverage multi-element imaging coils is not the same and is designed to both extend and improve the homogeneity of the coverage area provided by a conventional imaging coil. While the examples illustrate four imaging elements, it is to be appreciated that multi-element imaging coils may have three or more elements.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Signal" as used herein, includes but is not limited to one or more electrical or optical signals, analog or digital signals, data, one or more computer or processor instructions, messages, a bit or bit stream, or other means that can be received, transmitted and/or detected.

Prior Art FIG. 1 illustrates a portion 100 of an example opposed-solenoid antenna. The example portion 100 includes a first solenoid element 110 and a second solenoid element 120 located a distance $D_1$ apart. The type of opposed-solenoid antenna associated with portion 100 may be based on groups of loops (e.g., helical loops) separated by a gap, with current being driven in opposite directions on either side of the gap. Within the gap, field lines protrude beyond the diameter of elements 110 and 120, providing a substantially homogenous region of sensitivity suitable for endovascular imaging. The portion 100 of the example opposed-solenoid imaging antenna may have a limited area of longitudinal coverage that may reduce its effectiveness in longitudinal coverage of a vessel wall in, for example, applications like survey imaging.

Figure 2:
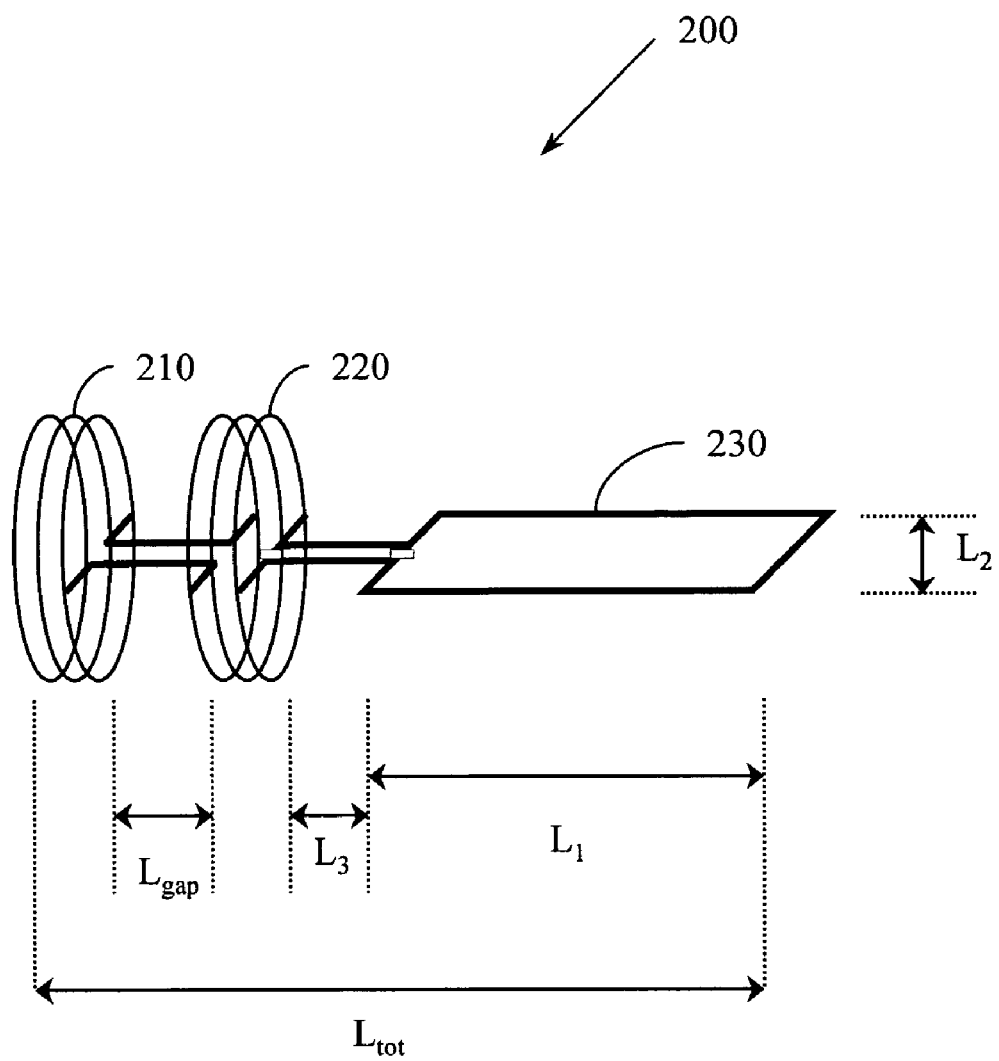
FIG. 2 illustrates a portion of an example hybrid antenna with opposed-solenoid elements and an additional single loop coil.

Thus, FIG. 2 illustrates a portion 200 of an example antenna that includes two opposed-solenoid elements (210, 220) and an additional single loop coil 230. In one example, the antenna may be part of an MRI coil that is configured to be positionable by a catheter that is operably connectable to an MRI apparatus. The coil may include a capacitor(s) (not illustrated) that are configured to facilitate tuning the antenna to the Lamor frequency for use in MRI applications. The coil may also include detuning elements, either passive and/or active, that are configured to facilitate detuning the antenna during RF transmission. This may facilitate reducing patient risk. Thus, the portion 200 may be employed with an MRI apparatus configured for applications like intravascular imaging. In one example, a coil including portion 200 may be configured as a multi-channel coil. In another example, a coil including portion 200 may be configured to facilitate selectively providing low resolution survey imaging and high resolution examination imaging.

A coil including portion 200 may include two solenoid imaging elements (210, 220) that are positioned along the longitudinal axis of a catheter in a manner that makes them operate as opposed-solenoid imaging elements. For an opposed solenoid imaging element, being "positioned along the longitudinal axis" means being substantially centered about and being substantially perpendicular to the longitudinal axis. The opposed-solenoid imaging elements 210 and 220 may be separated by a gap region with a current being driven in opposite directions in imaging elements on either side of the gap region. For example, the wire elements may be wound in a first direction around imaging element 210 and in a second, opposite direction, around imaging element 220. In one example, imaging elements 210 and 220 may be made from two or more windings of copper magnet wire (e.g., AWG 30 gauge) with a pitch spacing of about one wire diameter.

A coil including portion 200 may also include a single loop imaging element 230 that is positioned along the longitudinal axis of the catheter and outside the gap region. For a single loop imaging element, being positioned "along the longitudinal axis" means being in a plane that includes the axis. In one example, the single loop imaging element 230 may have a long axis length ($L_1$) between 6.5 mm and 16.5 mm, a short axis length ($L_2$) approximately equal to the diameter of a wire used to form imaging elements 210 or 220, and a separation distance ($L_3$) between 0 mm and 6.5 mm from one of the opposed-solenoid imaging elements (e.g., 220). In one example, the total length of the coil is less than 22 mm. As used in this example, "approximately" means plus or minus 0.5 mm.

In portion 200, imaging element 210, imaging element 220, and imaging element 230 may, along with a capacitor(s), detuning elements, and/or preamplifier circuitry (not illustrated) form a circuit in an MRI coil. Additionally, imaging element 210, imaging element 220, and imaging element 230 may be positioned relative to each other and with respect to the longitudinal axis of the catheter to produce a sensitivity profile that is radially homogenous. Furthermore, the combination of imaging elements 210, 220, and 230 may provide a coverage area greater than what would be provided by just imaging elements 210 and 220.

An antenna including portion 200 may be operably attached to different apparatuses in different applications. For example, an MRI apparatus may be configured with a catheter that is configured with an MRI coil that includes portion 200. This MRI apparatus may then be used in applications like intravascular imaging and other applications associated with imaging hollow organs (e.g., intestines), tubes (e.g., urethra), and so on.

Figure 3:
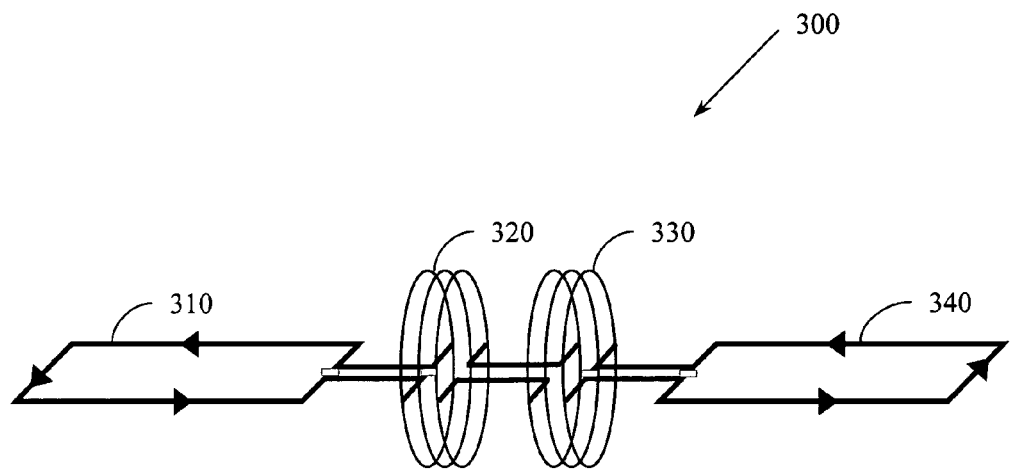
FIG. 3 illustrates a portion of an example hybrid antenna with opposed-solenoid elements and two additional single loop coils.

FIG. 3 illustrates a portion 300 of an example antenna that has two opposed-solenoid elements 320 and 330 and two additional single loop coils 310 and 340. An antenna including portion 300 may form part of an MRI coil. The MRI coil may be configured to be positionable by a catheter that is operably connectable to an MRI apparatus employed in applications like an intravascular imaging application. The coil may include a capacitor(s), detuning elements (e.g., passive, active), preamplifier circuitry, and so on, (not illustrated) that are configured to facilitate tuning the MRI coil to the Lamor frequency, improving patient safety, and so on.

The coil may include a first solenoid imaging element 320 and a second solenoid imaging element 330 arranged in an opposed-solenoid configuration. Element 320 and element 330 may be positioned along the longitudinal axis of the catheter and may be separated by a gap region with a current being driven in opposite directions in imaging elements on either side of the gap region. While this may produce a first region of longitudinal coverage for an imaging application, adding single loop elements 310 and 340 may increase the longitudinal coverage areas.

Thus, a coil including portion 300 may also include a first single loop imaging element 310 and a second single loop imaging element 340 that are positioned along the longitudinal axis and outside the gap region. Each of elements 310 and 340 may, for example, have a long axis length between 6.5 mm and 16.5 mm, a short axis length approximately equal to the diameter of a wire used to form element 320 or element 330 and a separation distance between 0 mm and 6.5 mm from at least one element 320 and element 330.

Elements 310, 320, 330, 340 and the capacitor may form a circuit, with the opposed-solenoid imaging elements 320 and 330 and the single loop imaging elements 310 and 340 being positioned relative to each other and with respect to the longitudinal axis of the catheter to produce a sensitivity profile that is radially homogenous. In one example, an MRI coil that includes portion 300 may be configured to selectively provide low resolution survey imaging and high resolution examination imaging. Additionally, the MRI coil may be configured as a multi-channel coil. In one example, single loop imaging elements 310 and 340 may be wound in the same direction while in another example, single loop imaging elements 310 and 340 may be counter-wound. In FIG. 3, the arrows on loops 310 and 340 indicate current flow and thus indicate that loops 330 and 340 are wound in the same direction.

Figure 4:
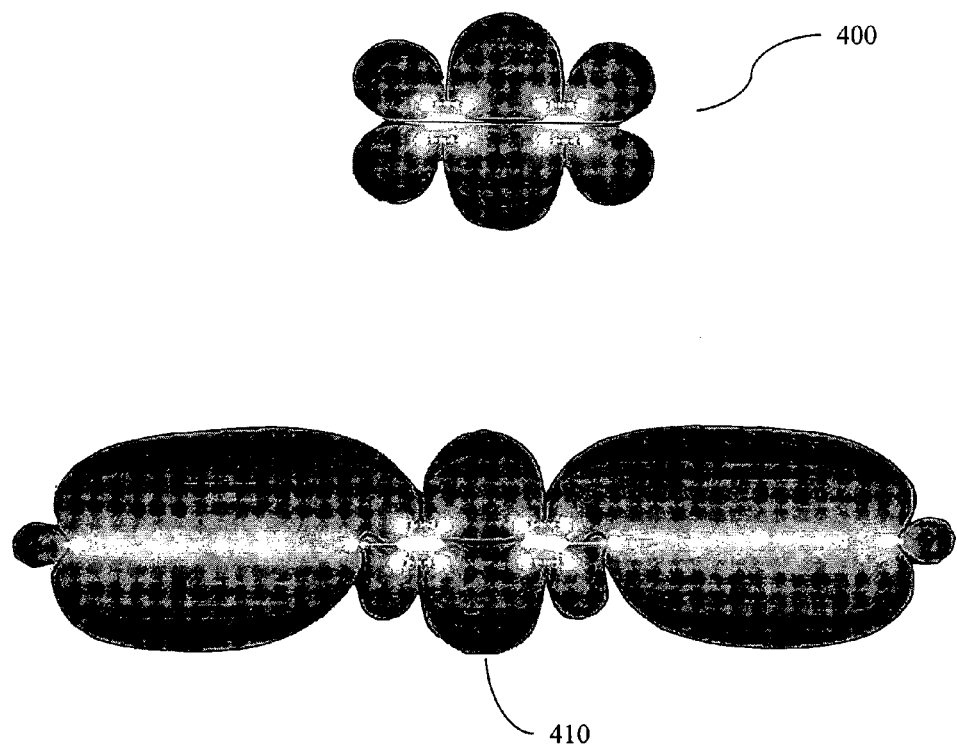
FIG. 4 illustrates $B_1$ sensitivity field plots for a conventional opposed-solenoid coil and for an example coil having both opposed-solenoid antenna elements and two additional single loop antenna elements.

FIG. 4 illustrates $B_1$ field plots for a conventional opposed-solenoid coil and for an example coil having both opposed-solenoid antenna elements and two additional single loop antenna elements like that illustrated in FIG. 3. Plot 400 shows a field associated with a conventional opposed-solenoid coil. Plot 410 illustrates a field associated with a hybrid coil including elements like those illustrated in FIG. 3. While plots 400 and 410 are not exactly to scale, they illustrate that the hybrid coil including elements like those that illustrated in FIG. 3 provides an extended coverage area over that provided by a conventional opposed-solenoid antenna like that illustrated in Prior Art FIG. 1.

Figure 5:
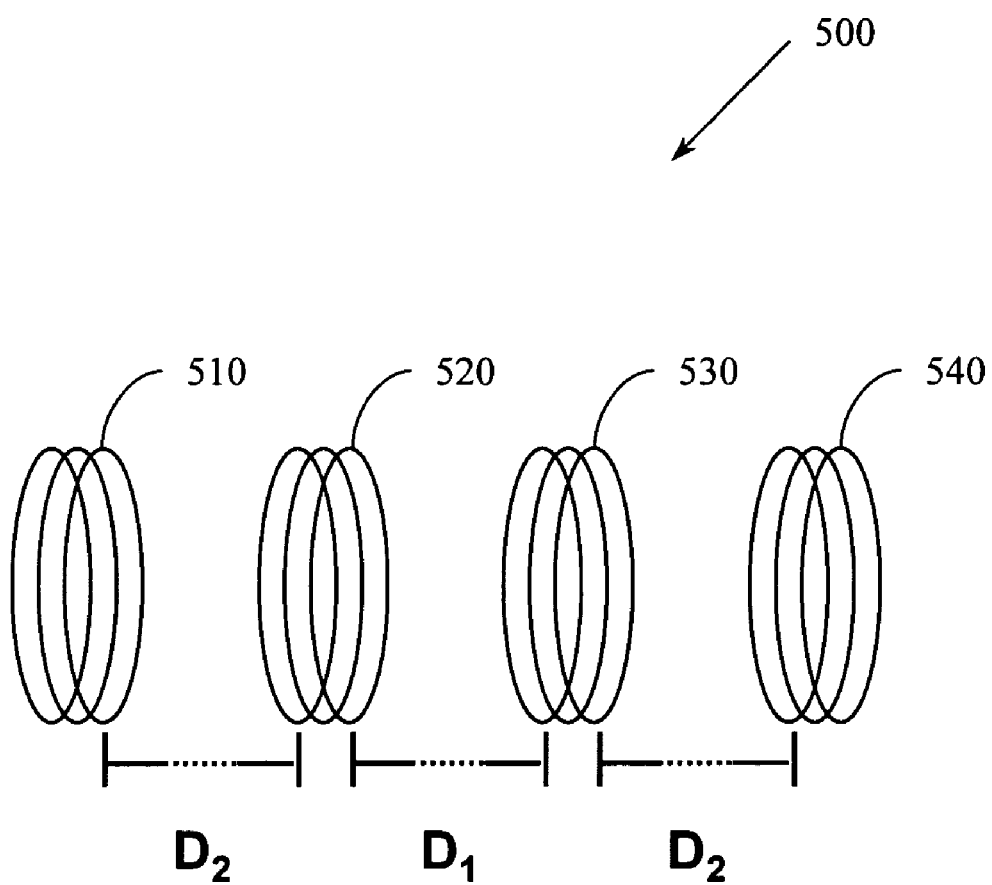
FIG. 5 illustrates a portion of an example four element opposed-solenoid, extended-coverage imaging coil.

FIG. 5 illustrates a portion 500 of an example four-element opposed-solenoid antenna. An antenna including portion 500 may be part of a multi-element, extended-coverage MRI coil. The coil may include, for example, two opposed-solenoid imaging elements positioned a first distance apart along the longitudinal axis of a catheter with which the coil is associated. For example, opposed-solenoid imaging elements 520 and 530 are positioned a first distance $D_1$ apart. Imaging elements 520 and 530 may be separated by a gap region and have a current driven in opposite directions in the elements on either side of the gap region.

A coil including portion 500 may also include an additional opposed-solenoid imaging element(s) that is positioned along the longitudinal axis and outside the gap region. For example, imaging elements 510 and 540 illustrate two additional opposed-solenoid imaging elements that are positioned along the longitudinal axis and outside the gap region between elements 520 and 530. The two opposed-solenoid imaging elements 520 and 530 and the additional opposed-solenoid imaging elements 510 and 540 form a circuit that is configured to facilitate producing a substantially radially homogenous sensitivity profile in an MRI imaging application. In one example, elements 510 through 540 are configured to be operably connectable to a catheter that is operably connectable to an MRI apparatus.

While four imaging elements are illustrated in portion 500, it is to be appreciated that in other examples, a multi-element, extended-coverage MRI coil may include an antenna with three or more opposed-solenoid imaging elements. A spacing between the imaging elements that is optimal for extending coverage could depend, for example, on the gauge of the wire used to form the imaging elements. Additionally, as the number of elements increases, the elements may need to be spaced further apart and/or closer together. Also, as the number of elements increases beyond three, the spacing between the outermost elements and a neighboring inner element may increase or decrease relative to a spacing between more innermost neighbors.

In one example having three imaging elements, the distance between a first set of two of the elements may be about 3.3 mm while the distance between a second set of two of the elements may be about 4.0 mm. "About", in this context, means plus or minus 0.1 mm. In another example, having four imaging elements, the distance between two inner elements may be about 3.3 mm while the distance between an outer element and an inner element may be about 4.0 mm. In another example having five or more imaging elements, the distance between the two inner elements may be about 4.3 mm and the distance between an outermost element and a neighboring inner element may be about 5.0 mm. As described above, an optimal spacing for extending coverage may depend on wire gauge. Thus, in one example having six total imaging elements, the distance between two innermost imaging elements may be about 2.6 times the diameter of a wire used to form an innermost imaging element, the distance between the next two innermost imaging elements may be about 7.8 times the diameter of the wire, and the distance between two outermost imaging elements may be about 13.8 times the diameter of the wire. These example uneven spacings facilitate extending the coverage area provided by the example antennas.

A coil including portion 500 may be used, for example, in MRI applications like an intravascular imaging application. Thus, in one example, the coil may be configured as a multi-channel coil. Additionally, in one example, the coil may be configured to selectively provide low resolution tracking imaging and high resolution examination imaging, and/or for selecting specific imaging regions to optimize image signal-to-noise ratio (SNR). While FIG. 5 illustrates three gaps and two distances (e.g., $D_1$, $D_2$), it is to be appreciated that the three gaps could have three different sizes (e.g., $D_1$, $D_2$, $D_3$).

Figure 6:
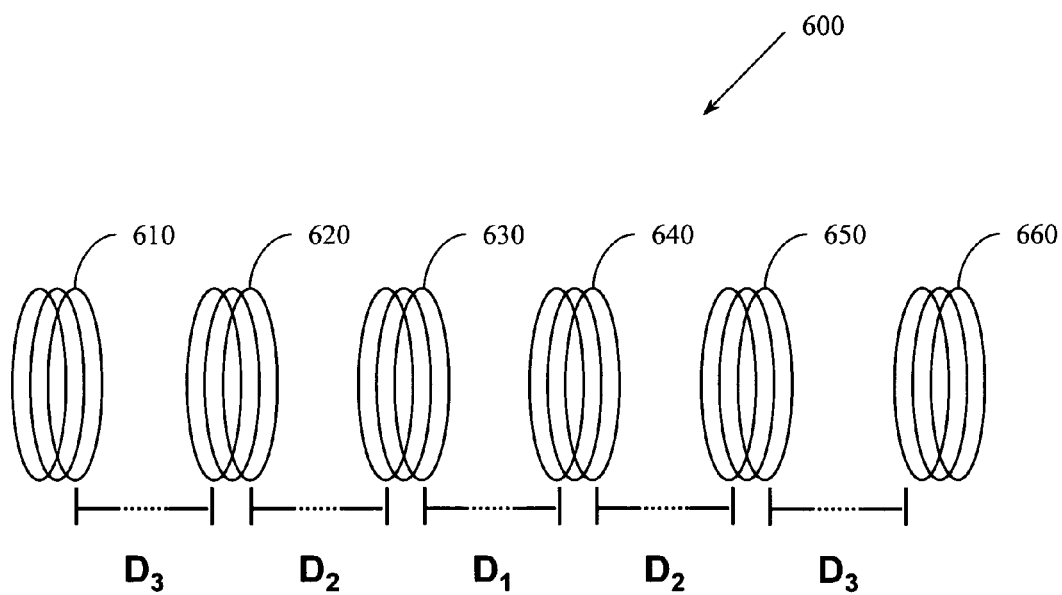
FIG. 6 illustrates portions of an example six element opposed-solenoid, extended-coverage, imaging coil.
Figure 7:
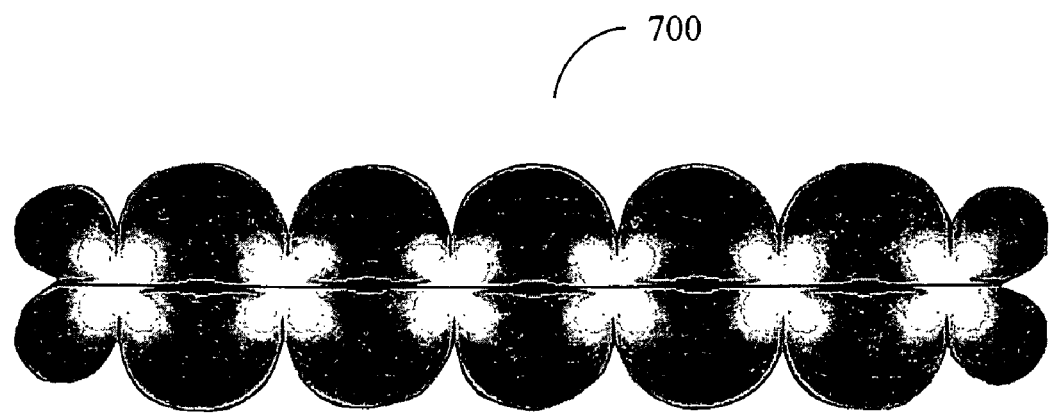
FIG. 7 illustrates a $B_1$ field plot for an example imaging coil having six opposed-solenoid antenna elements with optimized, uneven spacing.

FIG. 6 illustrates a portion 600 of an example six-element opposed-solenoid antenna. FIG. 7 illustrates a $B_1$ field plot for an example imaging coil having an antenna that includes portion 600 (e.g., has six opposed-solenoid antenna elements with optimized, uneven spacing). Portion 600 may be part of a device that is associated with magnetic resonance imaging. The device may include a catheter (not illustrated) that facilitates maneuvering the antenna associated with portion 600 in, for example, an intravascular application. The catheter may also facilitate operably connecting the antenna associated with portion 600 to an MRI apparatus.

An antenna associated with portion 600 may include a first solenoid antenna element 630 and a second solenoid antenna element 640 that is positioned a first distance $D_1$ along the longitudinal axis of the catheter from the first solenoid antenna element 630. The first solenoid antenna element 630 and the second solenoid antenna element 640 may be positioned to make them operate as opposed solenoid antenna elements.

An antenna associated with portion 600 may also include additional solenoid antenna elements. While antenna 600 illustrates six total elements, it is to be appreciated that various example multi-element, extended-coverage imaging coils may have three or more antenna elements.

Thus, portion 600 illustrates a third solenoid antenna element 620 positioned along the longitudinal axis of the catheter neighboring the first solenoid antenna element 630 and outside a gap produced by first solenoid antenna element 630 and second solenoid antenna element 640. The third solenoid antenna element 620 is positioned a second distance $D_2$ from first solenoid antenna element 630. The distance between the elements may depend, at least in part, on the gauge of the wire used to form portion 600. In one example, antenna elements 630, 640, and 620 form a circuit and may be arranged relative to each other and with respect to the longitudinal axis of the catheter to produce a sensitivity profile that is substantially radially homogenous and that provides an extended coverage area over three evenly spaced solenoid antenna elements. Thus, in one example, portion 600 may only include imaging elements 620, 630, and 640. In this example, the distance between element 630 and 640 may be about 3.3 mm and the distance between element 620 and element 630 may be about 4.0 mm.

In another example, portion 600 may include a fourth solenoid antenna element 650 that is positioned along the longitudinal axis of the catheter neighboring the second solenoid antenna element 640 and outside the gap between elements 630 and 640. The fourth solenoid antenna element 650 may also be positioned the second distance from the second solenoid antenna element 640. When the antenna 600 has four elements, the first distance may be about 3.3 mm and the second distance may be about 4.0 mm.

Antenna elements 620, 630, 640, and 650 may form a circuit and be configured relative to each other and with respect to the longitudinal axis of the catheter to produce a sensitivity profile that is substantially radially homogenous and provides extended coverage over that provided by four evenly spaced elements.

In another example, portion 600 may include a fifth solenoid antenna element 610 that is positioned along the longitudinal axis of the catheter neighboring the third solenoid antenna element 620. The fifth solenoid antenna element 610 may be positioned a third distance $D_3$ from the third solenoid antenna element 620. In this example, the first distance may be about 4.3 mm, the second distance may be about 4.3 mm, and the third distance may be about 5.0 mm. Antenna elements 610, 620, 630, 640, and 650 may form a circuit and be configured relative to each other and with respect to the longitudinal axis of the catheter to produce a sensitivity profile that is substantially radially homogenous and greater than that provided by five evenly spaced imaging elements.

In another example, portion 600 may include a sixth solenoid antenna element 660 that is positioned along the longitudinal axis of the catheter neighboring the fourth solenoid antenna element 650. The sixth solenoid antenna element 660 may be positioned the third distance from the fourth solenoid antenna element 650. In the example where antenna 600 includes six elements, the distance between elements 630 and 640 may be about 4.3 mm, the distance between 620/630 and 640/650 may be about 4.3 mm, and the distance between 610/620 and 650/660 may be about 5.0 mm. Antenna elements 610 through 660 may be configured relative to each other and with respect to the longitudinal axis of the catheter to produce a sensitivity profile that is substantially radially homogenous and greater than that provided by six evenly spaced imaging elements. While FIG. 6 illustrates five gaps having three different sizes (e.g., $D_1$, $D_2$, $D_3$), it is to be appreciated that the five gaps may have a different number of uneven gap sizes (e.g., $D_1$, $D_2$, $D_3$, $D_4$, $D_5$).

Figure 8:
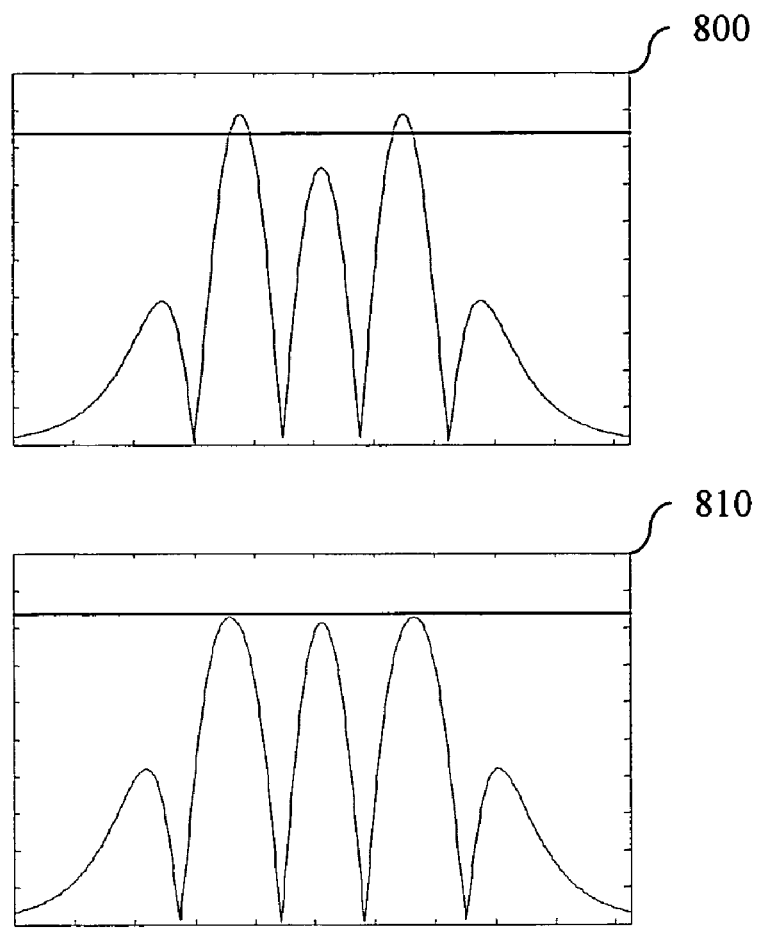
FIG. 8 illustrates Biot-Savart simulation results associated with a conventional four element opposed-solenoid coil with even spacing and a four element opposed-solenoid coil with optimized uneven spacing.

FIG. 8 illustrates a line profile plot from Biot-Savart simulation results associated with a conventional four element opposed-solenoid coil with even spacing and a four element opposed-solenoid coil with optimized uneven spacing. As can be seen, simulation 810, which is associated with optimally spaced elements provides a more substantially uniform coverage than simulation 800, which is associated with evenly spaced elements.

Figure 9:
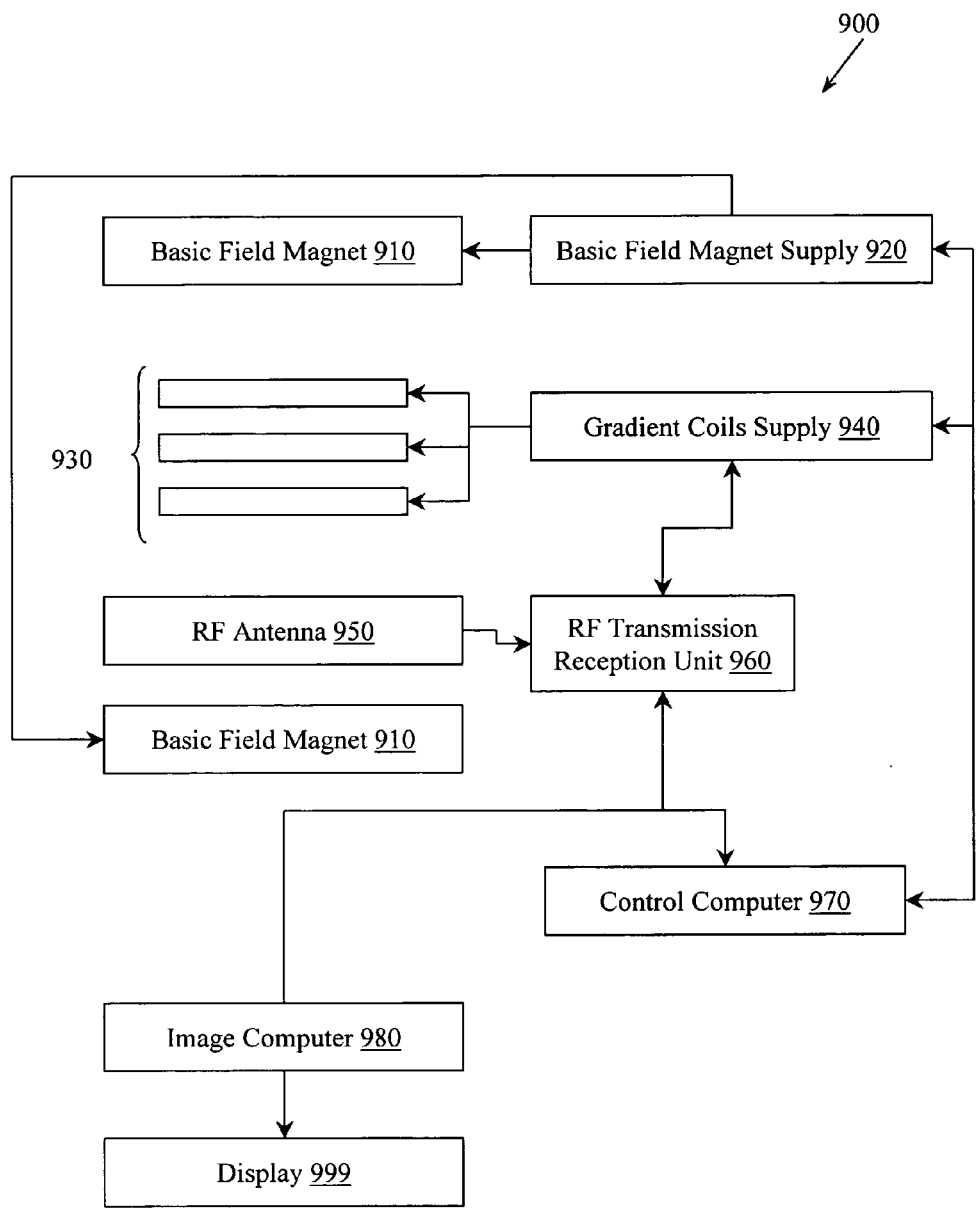
FIG. 9 illustrates an example MRI apparatus configured to operate with an extended-coverage imaging coil.

FIG. 9 illustrates an example MRI apparatus 900 configured to operate with an extended-coverage imaging coil. The apparatus 900 includes a basic field magnet(s) 910 and a basic field magnet supply 920. Ideally, the basic field magnet(s) 910 would produce a uniform $B_0$ field. However, in practice, the $B_0$ field may not be uniform, and may vary over an object being imaged by the MRI apparatus 900.

The MRI apparatus 900 may include gradient coils 930 configured to emit gradient magnetic fields like $G_S$, $G_P$ and $G_R$. The gradient coils 930 may be controlled, at least in part, by a gradient coils supply 940. The MRI apparatus 900 may also include an RF antenna 950 that is configured to generate RF pulses and to receive resulting magnetic resonance signals from an object to which the RF pulses are directed. The RF antenna 950 may be controlled, at least in part, by an RF transmission/reception unit 960. The gradient coils supply 940 and the RF transmission/reception unit 960 may be controlled, at least in part, by a control computer 970.

The RF antenna 950 may include, for example, a multi-element extended-coverage imaging coil like those described herein. The RF antenna 950 may be associated with (e.g., be located on, be located in, be fabricated into) a catheter. The catheter may then be employed to maneuver the antenna in, for example, a human vasculature. In one example, the RF antenna 950 may be configured to provide a first lower resolution for applications like locating interesting regions and also to provide a second higher resolution for applications like examining a located interesting region. An interesting region may be, for example, an artery wall that presents indicia of atherosclerosis or vessel stenosis. In another example, the RF antenna 950 may be configured as a multi-channel coil.

The magnetic resonance signals received from the RF antenna 950 can be employed to generate an image, and thus may be subject to a transformation process like a two dimensional FFT that generates pixilated image data. The transformation can be performed by an image computer 980 or other similar processing device. The image data may then be shown on a display 999. While FIG. 9 illustrates an example MRI apparatus 900 that includes various components connected in various ways, it is to be appreciated that other MRI apparatus may include other components connected in other ways.

Figure 10:
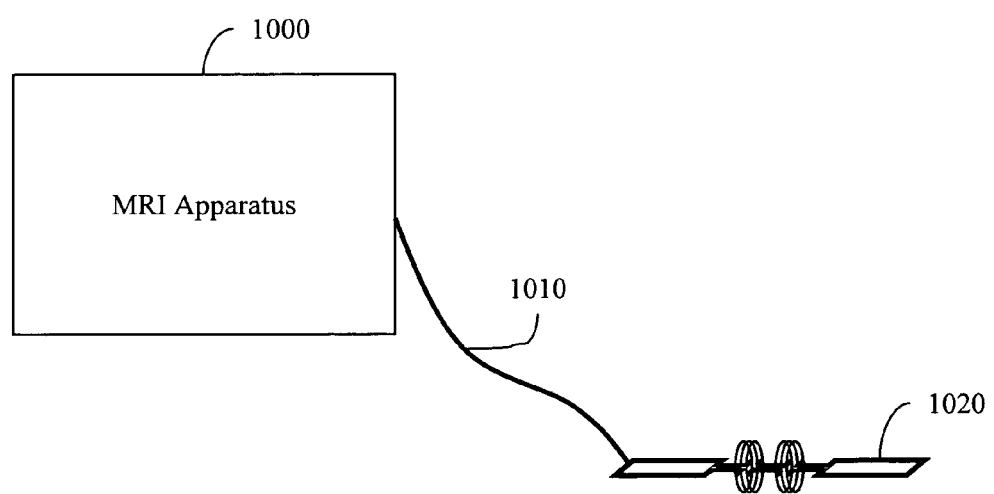
FIG. 10 illustrates an example MRI apparatus operably connected to an extended-coverage imaging coil.

FIG. 10 illustrates an example MRI apparatus 1000 operably connected by a catheter 1010 to an extended-coverage imaging coil 1020. FIG. 10 is not drawn to scale. The catheter 1010 may include a catheter body attached to coil 1020. Coil 1020 may include an antenna that includes first and second antenna elements attached to the catheter body. The first and second antenna elements may be positioned a first distance apart along the longitudinal axis of the catheter body in an opposed-solenoid configuration. The antenna may also include third and fourth antenna elements that are attached to the catheter body and positioned along the longitudinal axis of the catheter body to bracket the first and second antenna elements. The third antenna element may be positioned a second distance from the first antenna element and not between the first and second antenna elements. Similarly, the fourth antenna element may be positioned the second distance from the second antenna element and not between the first and second antenna elements. In one example, the third and fourth antenna elements may be configured in an opposed-solenoid configuration. In another example, the antenna 1020 may include a combination of opposed solenoid elements and single loop elements.

Coil 1020 may also include a fifth antenna element, a sixth antenna element, and so on, that are attached to the catheter body and positioned along the longitudinal axis of the catheter to bracket the third and fourth antenna elements. These additional elements, (e.g., the fifth antenna element, the sixth antenna elements) may be positioned at distances optimal to extending coverage by coil 1020.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A magnetic resonance imaging (MRI) coil configured to be positionable by a catheter that is operably connectable to an MRI apparatus, the coil comprising:
   one or more capacitors configured to facilitate one or more of, tuning the MRI coil to the Lamor frequency, and matching the MRI coil to a receiver in the MRI apparatus;
   one or more detuning elements;
   two opposed-solenoid imaging elements positioned along the longitudinal axis of the catheter and being substantially perpendicular to the longitudinal axis, the two opposed-solenoid imaging elements being separated by a gap region with a current being driven in opposite directions in the opposed-solenoid imaging elements on either side of the gap region; and
   one or more single loop imaging elements positioned along the longitudinal axis of the catheter, being substantially parallel to the longitudinal axis, and outside the gap region;
   the two opposed-solenoid imaging elements, the one or more single loop imaging elements, and the one or more capacitors forming a circuit,
   the two opposed-solenoid imaging elements and the one or more single loop imaging elements being positioned relative to each other and with respect to the longitudinal axis of the catheter to produce a sensitivity profile that is radially homogenous.

2. The MRI coil of claim 1, the MRI apparatus is employed in an intravascular imaging application.

3. The MRI coil of claim 1, the MRI coil is configured to selectively provide low resolution survey imaging and high resolution examination imaging.

4. The MRI coil of claim 1, the two opposed-solenoid imaging elements comprising two or more windings of copper magnet wire with a pitch spacing of about one copper magnet wire diameter.

5. The MRI coil of claim 1, the MRI coil is configured as a multi-channel coil.

6. The MRI coil of claim 1, where the one or more single loop imaging elements comprise two single loop imaging elements wound in the same direction.

7. The MRI coil of claim 1, where the one or more single loop imaging elements comprise two counter-wound single loop imaging elements.

8. The MRI coil of claim 1, the one or more single loop imaging elements each having a long axis length between 6.5 mm and 16.5 mm, a short axis length approximately equal to a diameter of a wire used to form one of the two opposed-solenoid imaging elements, and a separation distance between 0 mm and 6.5 mm from at least one of the two opposed-solenoid imaging elements.

9. The MRI coil of claim 1, the total length of the MRI coil is less than 22 mm.

10. A magnetic resonance imaging apparatus configured with a catheter configured with the MRI coil of claim 1.

11. A magnetic resonance imaging (MRI) coil configured to be positionable by a catheter that is operably connectable to an MRI apparatus employed in an intravascular imaging application, the coil comprising:
   one or more capacitors configured to facilitate one or more of, tuning the MRI coil to the Lamor frequency, and matching the MRI coil to a receiver of the MRI apparatus;
   one or more detuning elements;
   two opposed-solenoid imaging elements positioned along the longitudinal axis of the catheter and being substantially perpendicular to the longitudinal axis, the two opposed-solenoid imaging elements being separated by a gap region with a current being driven in opposite directions in the opposed-solenoid imaging elements on either side of the gap region; and
   one or more single loop imaging elements positioned along the longitudinal axis of the catheter and outside the gap region, being substantially parallel to the longitudinal axis, each having a long axis length between 6.5 mm and 16.5 mm, a short axis length approximately equal to the diameter of a wire used to form one of the two opposed-solenoid imaging elements, and a separation distance between 0 mm and 6.5 mm from at least one of the two opposed-solenoid imaging elements;
   the two opposed-solenoid imaging elements, the one or more single loop imaging elements, and the capacitor forming a circuit,
   the two opposed-solenoid imaging elements and the one or more single loop imaging elements being positioned relative to each other and with respect to the longitudinal axis of the catheter to produce a sensitivity profile that is radially homogenous,
   the MRI coil being configured to selectively provide low resolution survey imaging and high resolution examination imaging, and
   the MRI coil being configured as a multi-channel coil that facilitates selectively performing parallel imaging.

* * * * *